United States Patent
Boas et al.

(10) Patent No.: US 7,760,536 B2
(45) Date of Patent: Jul. 20, 2010

(54) NON-VOLATILE MEMORY CELL

(75) Inventors: Andre Luis Vilas Boas, Campinas (BR); Alfredo Olmos, Campinas (BR)

(73) Assignee: Freescale Semiconductor, Inc., Austin, TX (US)

( * ) Notice: Subject to any disclaimer, the term of this patent is extended or adjusted under 35 U.S.C. 154(b) by 911 days.

(21) Appl. No.: 11/410,584

(22) Filed: Apr. 25, 2006

(65) Prior Publication Data
US 2007/0247888 A1    Oct. 25, 2007

(51) Int. Cl.
*G11C 17/00*    (2006.01)
(52) U.S. Cl. .................. 365/96; 365/194; 365/225.7
(58) Field of Classification Search .............. 365/96, 365/194, 225.7
See application file for complete search history.

(56) References Cited

U.S. PATENT DOCUMENTS

| | | | | |
|---|---|---|---|---|
| 5,058,070 | A * | 10/1991 | Faber et al. ............... | 365/200 |
| 6,087,889 | A | 7/2000 | Mok | |
| 6,175,261 | B1 | 1/2001 | Sundararaman et al. | |
| 6,346,845 | B1 | 2/2002 | Choi | |
| 6,384,664 | B1 | 5/2002 | Hellums et al. | |
| 6,654,304 | B1 | 11/2003 | Huang | |
| 6,670,843 | B1 | 12/2003 | Moench et al. | |
| 6,906,557 | B1 | 6/2005 | Parker et al. | |
| 7,498,864 | B2 * | 3/2009 | Grover ...................... | 327/525 |

OTHER PUBLICATIONS

U.S. Appl. No. 11/135,963, filed May 24, 2005; Non-Volatile Memory Cell.

* cited by examiner

*Primary Examiner*—N Drew Richards
*Assistant Examiner*—Joannie A Garcia

(57) ABSTRACT

A non-volatile memory cell and method for reading it are disclosed. In one embodiment, the non-volatile memory cell includes a fuse with a first terminal coupled to a first power supply voltage terminal, and a second terminal, a first transistor having a first current electrode coupled to the second terminal of the programmable fuse, a second current electrode, and a control electrode, and a second transistor having a first current electrode connected to the first power supply voltage terminal, a control electrode coupled to the control electrode of the first transistor, and a second current electrode coupled to the control electrode. By applying a read signal to the control electrode of the first transistor, the state of the cell (blown or unblown) is read.

11 Claims, 2 Drawing Sheets

NON-VOLATILE MEMORY CELL

FIELD OF THE DISCLOSURE

The disclosure relates generally to memory cells, and more particularly to non-volatile memory cells.

BACKGROUND

In many integrated circuit fabrication processes, it can be difficult to maintain uniform conditions. As a result, integrated circuits can have different electrical characteristics. For integrated circuits that vary outside of a desired range of an electrical specification, the integrated circuits must be discarded or modified to meet the electrical specification. Accordingly, it can be beneficial if the integrated circuit contains a trimming circuit to adjust the electrical characteristics of the integrated circuit.

In some integrated circuits, including read only memory (ROM) based devices, it can be difficult to store trimming related information because writing the trimming information into memory would use valuable memory. Other techniques of storing trimming related information that don't have memory have their own limitations. For example, floating gate cells are reliable but are expensive to make. Laser fuses can be used, but these fuses can be difficult to manufacture and test. Electrical fuses may also be used, but the state of an electrical fuse can be difficult to determine if the fuse is only partially blown. Accordingly, there is a need for a memory cell able to reliably store trimming related information, and that can be manufactured relatively inexpensively.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION OF THE DRAWINGS

A non-volatile memory cell and method for reading the memory cell are disclosed. In one embodiment, the non-volatile memory cell includes a fuse connected to a read circuit and a program circuit. By applying a control signal to the program circuit, the fuse can be blown. By applying a read signal to the read circuit, the state of the cell (blown or unblown) is read. The non-volatile memory cell can be used to store trimming information for components of an integrated circuit, such as a processor, a clock generator, or other components. The non-volatile memory cell can be formed using the same process used to form the integrated circuit components needing the trimming information.

Figure 1:
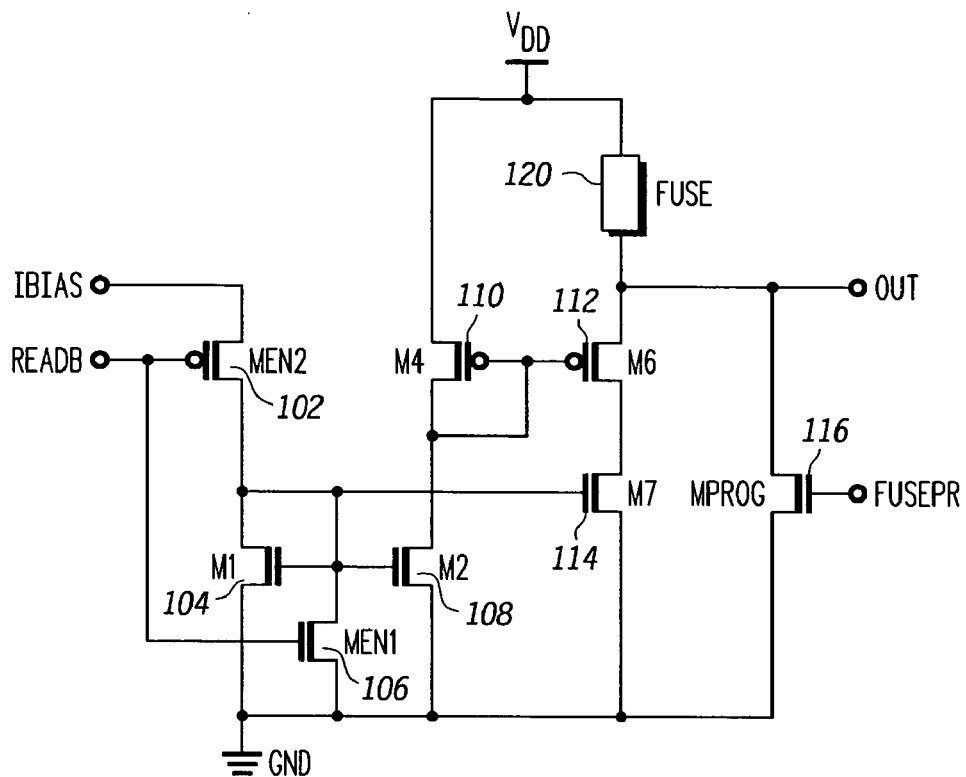
FIG. 1 illustrates in schematic form a circuit diagram of a particular embodiment of a non-volatile memory cell according to the present disclosure.

Referring to FIG. 1, a circuit diagram of a particular embodiment of a non-volatile memory cell 100 according to the present invention is illustrated. The non-volatile memory cell 100 includes a fuse 120, p-type transistors 102, 110, and 112 and n-type transistors 104, 106, 108, 114, and 116. In the illustrated embodiment, the non-volatile memory cell 100 does not incorporate floating gate transistors. This allows the circuit to be formed through a simpler manufacturing process.

The transistor 102 includes a first current electrode to receive a bias signal labeled "IBIAS", a second current electrode, and a control electrode to receive a control signal labeled "READB." The transistor 104 includes a first current electrode connected to the second current electrode of the transistor 102, a second current electrode coupled to a reference "GND" of a voltage supply, and a control electrode connected to the first current electrode of the transistor 104. The transistor 106 includes a first current electrode connected to the control electrode of the transistor 104, a second current electrode connect to the reference GND, and a control electrode to receive the signal READB. The transistor 108 includes a first current electrode, a second current electrode connected to the reference GND, and a control electrode connected to the control electrode of the transistor 104. The transistor 110 includes a first current electrode connected to a reference "VDD" of a voltage supply, a second current electrode connected to the first current electrode of the transistor 108, and a control electrode connected to the second current electrode of the transistor 110. The transistor 112 includes a first current electrode, a second current electrode, and a control electrode connected to the control electrode of the transistor 110. The transistor 114 includes a first current electrode connected to the second current electrode of the transistor 112, a second current electrode connected to the reference GND and a control electrode connected to the second current electrode of the transistor 102. The transistor 116 includes a first current electrode connected to the first current electrode of the transistor 112, a second current electrode connected to the reference GND, and a control electrode to receive a signal labeled "FUSEPR." In the illustrated embodiment, the transistors 110 and 112 are p-channel MOS transistors and the transistor 114 is an n-channel MOS transistor.

The fuse 120 includes a first current terminal connected to the reference VDD and a second current terminal connected to the first current terminal of the transistor 112, as well as to an output node labeled "OUT". In a particular embodiment, the fuse 120 is a polysilicon fuse.

The fuse 120 is programmed or "blown" by assertion of the FUSEPR signal at the transistor 116 and negation of the READB signal at the transistor 102. The transistor 116 thus performs as a fuse programming circuit. When the FUSEPR signal is asserted and the signal READB is negated, the voltage at the power supply voltage reference VDD is applied to the fuse 120, driving a relatively high current through the fuse. This current alters the impedance value of the fuse 120 by heating the polysilicon material of the fuse, causing it to melt. After the current has been driven through the fuse 120, the fuse material cools and the fuse is in a state referred to as a blown or programmed state. The fuse 120 in a blown state has a relatively high impedance compared to the fuse in an unblown state. However, it is still possible for there to be some conductive material in the fuse 120 after the fuse has been driven. The non-volatile memory cell 100 is sensitive to changes in the impedance of the fuse 120. This can provide an advantage in that the non-volatile memory cell 100 functions when the fuse 120 is only partially blown.

In one embodiment, the fuse 120 is a polysilicon fuse with a total resistance of approximately 30 ohms. The fuse 120 is formed in an hourglass shape, with a tapered center and flared extremes to help ensure a current density that will melt the fuse during programming. The fuse 120 takes approximately 5 milliseconds to melt at a current of 15 mA. Programming of the fuse 120 can be achieved with a voltage supply down to about 3 volts.

The state of the non-volatile memory cell 100 may be read as follows. Negation of the READB signal, e.g. at a logic high, will precharge the non-volatile memory cell 100 to a first state. In particular, negation of the READB signal will cause the transistor 106 to become conductive and the transistors 102, 104, 108 and 114 to be nonconductive. Accordingly, if the fuse 120 is in a blown state, the output OUT will be placed in an indeterminate state, while if the fuse 120 is in an unblown state, the output OUT will be pulled to a logic high.

When the READB signal is asserted, the transistor 102 becomes conductive, thereby asserting the signal IBIAS at the control electrodes of the transistors 104, 108, and 114, causing these transistors to become conductive based upon the value of IBIAS. In turn, the transistors 110 and 112 become conductive, and the state of the output OUT will be determined based on the state of the fuse 120.

In the illustrated embodiment the transistor 110 and the transistor 112 are arranged as a current mirror to permit improved sensing of the state of the fuse 120. Further, the transistor 110 is connected to the reference VDD without an intervening resistor, thereby reducing the size of the non-volatile memory cell 100 and the number of components required to build the cell.

Figure 2:
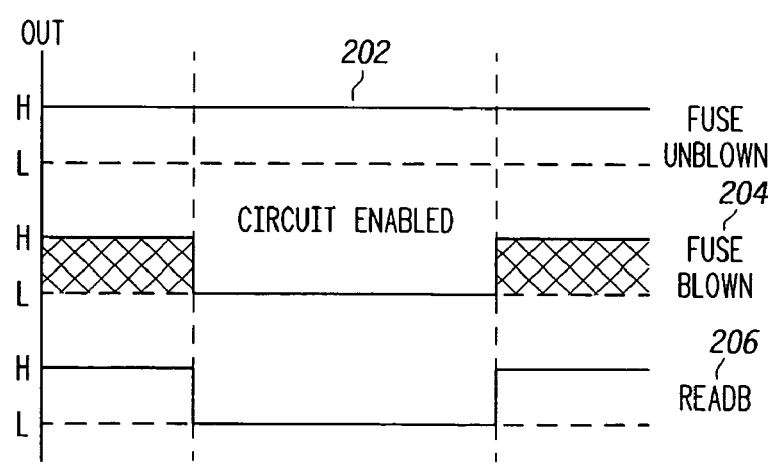
FIG. 2 illustrates a simplified timing diagram for the non-volatile memory cell of FIG. 1.

Referring to FIG. 2, a timing diagram 200 for the non-volatile memory cell 100 depicted in FIG. 1 is illustrated. The timing diagram 200 illustrates the state of the output of the non-volatile memory cell 100, depending on the state of the fuse and depending on the state of the signal READB.

As illustrated, when the signal READB is at a logic high (H) state, a non-volatile memory cell is preset to a first state in which signal OUT is at a logic high state when the fuse is in a FUSE UNBLOWN state, and to an indeterminate state when the fuse is in a FUSE BLOWN state. The non-volatile memory cell is selectively set to a second state in response to a condition of the fuse. In the FUSE UNBLOWN state, the signal OUT remains at a logic high state when the READB signal is placed at a logic low state. In the FUSE BLOWN state, the signal OUT is placed in a logic low state when the READB signal is place at a logic low state. In this way, the output of the static latch is representative of the state of the fuse.

Figure 3:
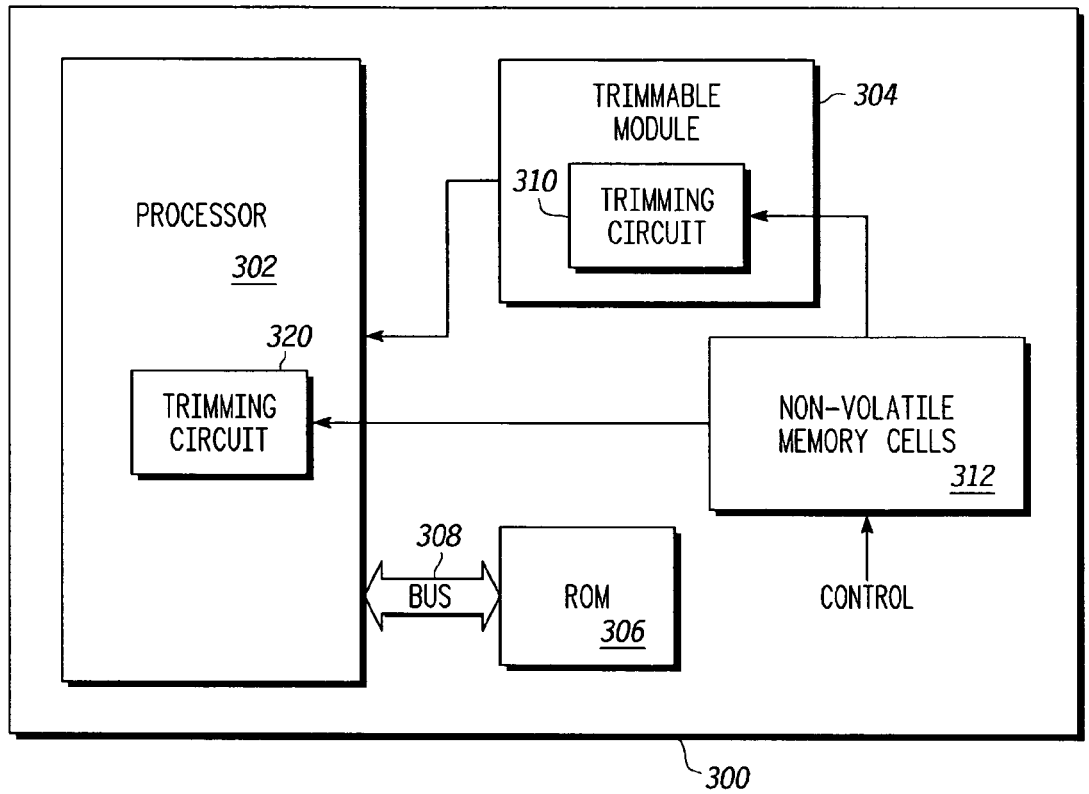
FIG. 3 illustrates in block diagram form a microcontroller (MCU) including non-volatile memory cells like the non-volatile memory cell of FIG. 1.

Referring to FIG. 3, a block diagram of an integrated circuit 300 incorporating a non-volatile memory cells is illustrated. As depicted, the integrated circuit 300 includes a processor 302, a trimmable module 304, a read-only memory (ROM) 306, a bus 308, a trimming circuit 310, and non-volatile memory cells 312.

The processor 302 is bi-directionally connected to the bus 308, and includes two inputs. The trimmable module 304 includes an output connected to an input of the processor 302 and an input. The ROM 306 is bi-directionally connected to the bus 308. The non-volatile memory cells 312 includes an output connected to the input of the trimmable module 304, an output connected to an input of the processor 302 and an input to receive a signal "CONTROL" to program one or more of the non-volatile memory cells 312 The non-volatile memory cells 312 include a plurality of one-time programmable (OTP) cells, like the non-volatile memory cell 100 of FIG. 1.

The trimmable module includes a trimming circuit 310, while the processor includes a trimming circuit 320. The trimming circuit 310 and the trimming circuit 320 are each connected to the non-volatile memory cells 312.

The ROM 306 stores information accessible to the processor 302. The processor accesses the information in the ROM 306 via the bus 308.

During operation, the non-volatile memory cells 312 store trimming information for one or more components of the integrated circuit 300. The trimming information is stored by programming one or more of the non-volatile memory cells 312 after the integrated circuit 300 is formed. The components of the integrated circuit 300 can adjust their characteristics or functions based on the trimming information. In an embodiment, the non-volatile memory cells 312 are formed using the same process as is used to form the components of the integrated circuit 300 that access the cells, thereby simplifying the formation process.

The trimmable module 304 may be a clock generator module, an analog module, or other appropriate module. The trimming circuit 310 accesses trimming information stored at the non-volatile memory cells 312 and trims the trimmable module 304 based on the trimming information. For example, if the trimmable module 304 is a clock generator module, the trimming circuit 310 can adjust the phase, frequency, or other characteristic of the generated clock signal based on the trimming information.

The trimming circuit 320 can also access the trimming information stored at the non-volatile memory cells 312. For example, the non-volatile memory cells can store identification information for the integrated circuit 300, speed path information, or other appropriate information. The trimming circuit 320 can change the characteristics and functions of the processor 302 based on the stored trimming information.

To access the trimming information stored at the non-volatile memory cells 312, the trimming circuit 310 or the trimming circuit 320 activates a signal, such as the READB signal illustrated in FIG. 2, to read the values of the non-volatile memory cells 312.

Figure 4:
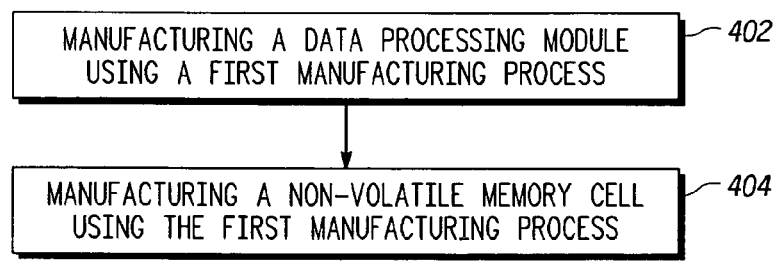
FIG. 4 illustrates a flow diagram of a method of manufaturing an integrated circuit in accordance with one embodiment of the present disclosure.

Referring to FIG. 4, a method of manufacturing an integrated circuit is illustrated. At block 402, a data processing module of the integrated circuit is manufactured using a first manufacturing process. The data processing module can be a clock generator, a processor, or other data processing module. The manufacturing process can be a CMOS process or other manufacturing process.

Moving to block 404, a non-volatile memory cell is manufactured using the first manufacturing process. By manufacturing the non-volatile memory cell and the data processing module using the same manufacturing process, the process of forming the integrated circuit is simplified.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all of the claims. For example, the use of a polysilicon fuse has been illustrated. It will be appreciated that, in an alternative embodiment another type of fuse may be employed. Furthermore, the fuse may be programmed or "blown" in a variety of ways, such as by application of a laser. Accordingly, the present disclosure is not intended to be limited to the specific form set forth herein, but on the contrary, it is intended to cover such alternatives, modifications, and equivalents, as can be reasonably included within the spirit and scope of the disclosure.

What is claimed is:

1. A device comprising:
a programmable fuse having a first terminal coupled to a first reference, and a second terminal;
a first transistor having a first current electrode coupled to the second terminal of the programmable fuse, a second current electrode, and a control electrode; and
a second transistor having a first current electrode connected to the first reference, a control electrode coupled to the control electrode of the first transistor, and a second current electrode coupled to the control electrode;
a third transistor having a first current electrode coupled to the second current electrode of the first transistor, a control terminal to receive a control signal, and a second, current electrode; and
a trimmable module, wherein the trimmable module has been manufactured using a first manufacturing process, and wherein the first transistor, the second transistor, and the third transistor have been manufactured using the first manufacturing process.

2. The device of claim 1, wherein the trimmable module is a clock generator module.

3. The device of claim 1, wherein the trimmable module is an analog module.

4. The device of claim 1, wherein the trimmable module is an identification module.

5. The device of claim 1, wherein the manufacturing process is a CMOS process.

6. A device, comprising:
a programmable fuse having a first terminal coupled to a first reference, and a second terminal;
a first transistor having a first current electrode coupled to the second terminal of the programmable fuse, a second current electrode, and a control electrode;
a second transistor having a first current electrode coupled to the first reference, a control electrode coupled to the control electrode of the first transistor, and a second current electrode coupled to the control electrode; and
a trimmable module coupled to the second terminal of the programmable fuse.

7. The device of claim 6, wherein the trimmable module, the first transistor, and the second transistor have been manufactured using a first manufacturing process.

8. The device of claim 6, further comprising:
a third transistor having a first current electrode coupled to the second current electrode of the first transistor, a control terminal to receive a control signal, and a second current electrode.

9. The device of claim 8, further comprising:
a fourth transistor having a first current electrode coupled to a first reference voltage, a control electrode to receive a read signal, and a second current electrode coupled to the control electrode of the third transistor.

10. A device, comprising:
a programmable fuse having a first terminal coupled to a first reference, and a second terminal;
a first transistor having a first current electrode coupled to the second terminal of the programmable fuse, a second current electrode, and a control electrode;
a second transistor having a first current electrode connected to the first reference, a control electrode coupled to the control electrode of the first transistor, and a second current electrode coupled to the control electrode;
a third transistor having a first current electrode coupled to the second current electrode of the first transistor, a control terminal to receive a control signal, and a second current electrode;
a cell read circuit coupled to the control electrode of the third transistor; and
a fourth transistor having a first current electrode coupled to a first reference voltage, a control electrode to receive a read signal, and a second current electrode coupled to the control electrode of the third transistor.

11. The device of claim 10, further comprising:
a fifth transistor having a first current electrode coupled to the control electrode of the second transistor, a control electrode coupled to the control electrode of the third transistor, and a second current electrode coupled to a second reference;
a sixth transistor having a first current electrode coupled to the control electrode of the third transistor, a control electrode coupled to the control electrode of the third transistor, and a second current electrode coupled to the second reference; and
a seventh transistor having a first current electrode coupled to the control electrode of the third transistor, a control electrode to receive the read signal, and a second current electrode coupled to the second reference.

* * * * *